US012671408B2

(12) United States Patent
Mohamed Halick et al.

(10) Patent No.: US 12,671,408 B2
(45) Date of Patent: Jun. 30, 2026

(54) SOLID STATE POWER CONTROLLER, POWER MANAGEMENT SYSTEM AND POWER CONVERTER

(71) Applicant: Rolls-Royce Deutschland Ltd & Co KG, Blankenfelde-Mahlow (DE)

(72) Inventors: Mohamed Sathik Mohamed Halick, Singapore (SG); Chandana Gajanayake, Singapore (SG); Anh Vu Ho, Singapore (SG); Pothuru Venkat Sai Virinchi, Singapore (SG)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 258 days.

(21) Appl. No.: 18/736,079

(22) Filed: Jun. 6, 2024

(65) Prior Publication Data

US 2025/0030414 A1 Jan. 23, 2025

(30) Foreign Application Priority Data

Jul. 18, 2023 (GB) ...................................... 2310966

(51) Int. Cl.
H03K 17/082 (2006.01)
H03K 17/06 (2006.01)
H03K 17/12 (2006.01)

(52) U.S. Cl.
CPC ......... H03K 17/0828 (2013.01); H03K 17/06 (2013.01); H03K 17/122 (2013.01); H03K 2217/0027 (2013.01)

(58) Field of Classification Search
CPC .. H03K 17/0828; H03K 17/06; H03K 17/122; H03K 2217/0027;

(Continued)

(56) References Cited

U.S. PATENT DOCUMENTS 9,071,245 B2 * 6/2015 Rozman ............... H03K 17/166
9,444,248 B2 * 9/2016 Erhart .................... H02H 9/025
(Continued)

FOREIGN PATENT DOCUMENTS

EP          3633811 A1      4/2020
WO    WO-2022118089 A1 *    6/2022    .......... H02M 1/0045

OTHER PUBLICATIONS

Extended European Search Report for EP Application No. 24181101. 7, mailed Nov. 8, 2024, pp. 1-9.

(Continued)

*Primary Examiner* — Monica Lewis
*Assistant Examiner* — Nicolas Bellido
(74) *Attorney, Agent, or Firm* — Lempia Summerfield Katz LLC

(57) ABSTRACT

A solid state power controller includes at least one semiconductor switch with a control terminal, a controller for generating a pulsed signal, and a gate driver circuit for receiving the pulsed signal and generating a pulsed driver signal. The gate driver circuit includes a gate driver for receiving the pulsed signal and providing a pulsed output signal, and driver signal generating device operable in a first state and a second state. The driver signal generating device receives the gate driver pulsed output signal and generates in the first state a first pulsed driver signal that operates a semiconductor switch in an active region and generates in the second state a second pulsed driver signal that operates the semiconductor switch in a saturated region. The controller is configured to set the driver signal generating device in the first or second state depending on a voltage level signal received by the controller.

18 Claims, 5 Drawing Sheets

(58) Field of Classification Search
CPC ...... H03K 2217/0081; H03K 17/0822; H02M
1/348; H02M 1/0045; H02M 1/08; H02M
1/36; H02H 9/001; H02H 9/025
See application file for complete search history.

(56) References Cited

U.S. PATENT DOCUMENTS

| | | |
|---|---|---|
| 2007/0108959 A1 | 5/2007 | Amano |
| 2013/0049686 A1 | 2/2013 | Erhart |
| 2014/0320194 A1 | 10/2014 | Rozman et al. |
| 2021/0376596 A1 | 12/2021 | Kim et al. |
| 2022/0173588 A1* | 6/2022 | Gajanayake ........... H02H 1/043 |

OTHER PUBLICATIONS

Satarupa Bal, et al., "Design Considerations of Bidirectional SiC based DC Solid-State Power Controller for MEA Systems," IECON 2018—44th Annual Conference of the IEEE Industrial Electronics Society, Oct. 21, 2018, pp. 5745-5752.
Yuanfeng Zhou, et al., "A Digital-Controlled SiC-Based Solid State Circuit Breaker with Soft-Start Function for DC Microgrids," 2018 9th IEEE International Symposium on Power Electronics for Distributed Generation Systems (PEDG), Jun. 25, 2018, pp. 1-7.
Great Britain Search Report for GB Application No. 2310966.3, mailed Jan. 24, 2024.

* cited by examiner

SOLID STATE POWER CONTROLLER, POWER MANAGEMENT SYSTEM AND POWER CONVERTER

This specification is based upon and claims the benefit of priority from United Kingdom patent application GB 2310966.3, filed Jul. 18, 2023, the entire contents of which are incorporated herein by reference.

TECHNICAL FIELD

The present disclosure relates a solid state power controller and a power management system as well as a power converter including such solid state power controller. Further, within the disclosure, apparatuses and methods for switching on capacitive loads while minimizing peak inrush current are disclosed.

BACKGROUND

There is a growing trend towards electrification of conventional aircrafts with the aim of reducing carbon emissions. A corresponding increase in voltage and power levels of more electric aircraft (MEA) and all electric aircraft (AEA) requires fast and intelligent protection circuits. The protection circuits in direct current (DC) electrical systems are critical for the reliability of the system. Due to the fact that SSPCs (Solid State Power Controllers, also referred to a Solid State Protection Controllers) show a fast response time, eliminate arcing during turn-off, and have a higher reliability, SSPCs are preferred over electro-mechanical switches. SSPCs combine the functions of connecting loads to a DC bus bars and protecting electrical installations against overload and short circuits.

One problem that has to be addressed lies in that capacitive loads such as load capacitor are common in a MEA or AEA distribution system. The connection of capacitive loads leads to inrush currents flowing through the SSPC during turn on. More particularly, during the connection of capacitive loads to a DC bus, there is a high overcurrent because of zero initial energy in the capacitive loads which may cause damage to the system. The traditional method used with electro-mechanical switches is to have a separate pre-charge resistor during the initial period and a contactor. Different control strategies are required for the connection process by SSPCs.

There is thus a need, irrespective of the concrete SSPCs configuration, to soft start charging the capacitive loads, as a sudden rise of inrush current and voltage spike may not only destroy the capacitor but may destroy the power devices and other connected applications.

Y. Zhou et al., "A Digital-Controlled SiC-Based Solid State Circuit Breaker with Soft-Start Function for DC Microgrids," *9th IEEE International Symposium on Power Electronics for Distributed Generation Systems* (PEDG), 2018, pp. 1-7 discuss a digital controlled SSPC with soft-start up function for DC microgrids. The SSPC has the DC bus and a capacitive load connected in parallel with a bleeding resistor. The main SSPC includes a buck converter with voltage/current/temperature sensors, and a digital signal processor. The SSPC offers three distinct operations states ON, OFF, and a PWM current limiting. The ON state and OFF state disallow any current flow, whereas the PWM state allows the SSPC to gradually charge the DC load capacitor to charge gradually to avoid capacitor inrush current and over voltage spike. However, additional circuitry similar to a buck converter needs to be connected in parallel with the semiconductor device. Such additional circuitry adds weight and size to the system, which is a critical factor, e.g., in aerospace applications.

There is a need to provide a solid state power controller for pre-charging/soft starting a capacitive load when connecting it to a DC bus that allows to efficiently suppress inrush current and voltage spikes during start up.

SUMMARY AND DESCRIPTION

In a first aspect, a solid state power controller is provided for limiting and/or breaking an electrical current flowing through a power transmission line. The solid state power controller includes at least one semiconductor switch with a control terminal, a controller configured to generate a pulsed signal, and a gate driver circuit configured to receive the pulsed signal generated by the controller and generate a pulsed driver signal that is applied to the control terminal of the at least one semiconductor switch.

It is further provided that the gate driver circuit includes a gate driver configured to receive from the controller the pulsed signal and provide a pulsed output signal. The gate driver circuit further includes a driver signal generating device configured to be operable in a first state and a second state, wherein the first and second states are controlled by the controller. The driver signal generating device is configured to receive the gate driver pulsed output signal and generate, in the first state, a first pulsed driver signal that operates the at least one semiconductor switch in an active region. The driver signal generating device is further configured to generate, in the second state, a second pulsed driver signal that operates the at least one semiconductor switch in a saturated region. The controller is configured to set the driver signal generating device in the first state or in the second state depending on a voltage level signal received by the controller.

Aspects of the present disclosure are thus based on the idea to drive the least one semiconductor switch with a pulsed driver signal that differs in a first state and a second state, wherein the pulsed driver signal operates the at least one semiconductor switch in an active region in the first state and operates the at least one semiconductor switch in a saturated region in the second state. As a semiconductor switch such as a MOSFET operates in the active region (also referred as linear or non-saturation region) at a lower gate voltage than when operating in the saturated region, the first pulsed driver signal has a lower voltage than the second pulsed driver signal.

The controller of the solid state power controller is configured to activate the first state or the second state depending on a received voltage level signal. This allows the solid state power controller to, e.g., pre-charge a capacitive load as long as a received voltage level signal is below a predefined threshold, as is the case during pre-charge, before the capacitive load is fully connected to a supply voltage. In this respect, by operating a semiconductor switch in an active region, parts of the voltage applied across the semiconductor switch are naturally blocked. By further using a pulsed driver signal, a sharp rise of inrush current is also prevented.

After pre-charging, the controller of the solid state power controller activates the second state in which the at least one semiconductor switch is operated in a saturated region.

Accordingly, the present disclosure allows to supress inrush currents and voltages during pre-charging, utilizing at least one semiconductor switch operated in the active region to charge a capacitive load.

A further advantage associated with the present disclosure lies in that a generalized approach is provided for that may be used with any off the shelf COTs gate drivers (COT=Commercial Off-The-Shelf). Also, the present disclosure does not require additional passive components or a device safe operating area characteristics curve. Irrespective of system operating condition and load profiles, the present disclosure is suitable to any kind of power converter application to charge a capacitor in a power system.

The solid state power controller may provide for further functions as known to the skilled person, such as shutting down an energy source or a load to prevent failure. In particular, the first state in which a first pulsed driver signal operates the at least one semiconductor switch in an active region allows for effective soft shutdown during device fault or cable fault.

In certain embodiments, the driver signal generating device includes: a first device or component configured to receive the pulsed output signal in the first state and generate the first pulsed driver signal; and a second device or component configured to receive the pulsed output signal in the second state and generate the second pulsed driver signal. Accordingly, the output of the driver circuit is applied to two different subcircuits, (e.g., the first device and the second device), which provide for different voltage levels of the respective pulsed output signal. Which one of the two subcircuits is activated is controlled by the controller that, e.g., provides enable signals to the respective sub-systems.

The first device may be implemented using a first buffer that operates under a first supply voltage. The second device may be implemented using a second buffer operating under a second supply voltage, wherein the first supply voltage is lower than the second supply voltage. Accordingly, the output signal of the second device has a higher voltage compared to output signal of the first device.

A buffer within the meaning of the present disclosure is an interposed element that has a single input connected to the gate driver output, and a single output connected to the at least one semiconductor switch (e.g., through a resistor). At the same time, the buffer may translate the voltage of the gate driver to the voltage needed by the semiconductor switch. The height of the translation of the voltage is defined by the supply voltage applied to the buffer.

In certain embodiments, a resistor-capacitor (RC)-circuit is arranged at the input of the first buffer (and behind the gate driver). The RC circuit smoothens the pulses received by the gate driver.

In certain embodiments, the driver signal generating device includes: a buffer configured to receive the pulsed output signal and generate a pulsed driver signal; and buffer output modifying device or component configured to reduce the voltage level of the generated pulsed driver signal. The buffer output modifying device is activatable by the controller. In the first state, the buffer output modifying device is activated, wherein the voltage level of the generated pulsed driver signal is reduced to provide the first pulsed driver signal. Further, in the second state, the buffer output modifying device is deactivated, wherein the generated pulsed driver signal is the second pulsed driver signal.

Accordingly, by activating or deactivating the buffer output modifying device, the first or second pulsed driver signal is provided for.

In such embodiments, the buffer output modifying device may include a current path that includes a transistor activatable by the controller and a second resistor connected in series to a first resistor, the first resistor arranged between the buffer and the at least one semiconductor switch, wherein the first resistor and the second resistor form a voltage divider for the at least one semiconductor switch. However, other devices or components for modifying the buffer output may be provided for instead.

The at least one semiconductor switch may include a metal-oxide-semiconductor field-effect transistor (MOSFET), an insulated-gate bipolar transistor (IGBT), a Gallium Nitride (GaN) transistor, a Silicon carbide (SiC) transistor, or any other kind of transistor. The gate of such semiconductor switch is the control terminal to which the pulsed driver signal is applied. The present disclosure may be applicable to all kind of power devices packaging technology such as IGBT, SiC, and GaN devices.

In certain embodiments, the at least one semiconductor switch includes a plurality of semiconductor switches arranged in parallel, wherein each semiconductor switch includes a control terminal to which the generated first or second pulsed driver signal is applied. By implementing a multiple parallel device configuration, high current and high voltage applications may be provided for.

In certain embodiments, a transient voltage suppressor diode and/or an RC snubber sequence are arranged in parallel to the plurality of semiconductor switches. This serves to suppress transient voltage spikes.

In certain embodiments, the solid state power controller further includes a measuring device or component configured to measure the voltage over a load capacitor, wherein the measuring device is configured to generate the voltage level signal received by the controller. The measuring device provides a feedback to the controller. The measuring device may provide information about the load capacitor actual charging voltage.

In certain embodiments, the controller is configured to set the driver signal generating device in the first state (i.e., pre-charging state) if the voltage level signal received by the controller indicates that a load capacitor is charged with less than a predefined percentage of a rated voltage, and the controller is configured to set the driver signal generating device in the second state if the voltage level signal received by the controller indicates that the load capacitor is charged with more than the predefined percentage of the rated voltage. In the second stage, the at least one semiconductor switch is operated in the saturation or operating region to fully charge a load capacitor of a load such as power converters.

The predefined percentage may be 90% of the rated voltage of the input voltage. However, other predefined percentages may be chosen as well.

In certain embodiments, the first and second pulsed driver signals are pulse-width modulated driver signals of high-frequency, wherein high-frequency may refer to a frequency in a range of 10 kilohertz to 100 kilohertz or higher. Fixed voltage pulses of controlled duration may be used in the pre-charging mode of the solid state power controller.

In a second aspect, a power management system is disclosed. The power management system includes: a DC power supply; a load and a load capacitor; and a power bus connecting the power supply and the load. The power bus includes a solid state power controller as disclosed herein. Further, the controller of the solid state power controller is configured to set the driver signal generating device in the first state in a pre-charging phase before the load is fully connected to the power supply.

In certain embodiments, the controller of the solid state power controller is configured to set the driver signal generating device in the first state if the voltage level signal received by the controller indicates that the load capacitor is charged with less than a predefined percentage of a rated voltage.

The present disclosure is applicable to all kind of load capacitor packaging technology such as aluminium electrolytic, film, compact capacitors (e.g., CERALINK™ capacitors), and ceramic capacitors.

In a third aspect, a power converter is disclosed. The power converter includes: a DC power supply having a DC positive terminal, a DC negative terminal, and a DC voltage $U_B$; a high side voltage rail connected to the DC positive terminal; a low side voltage rail connected to the DC negative terminal; a load capacitor arranged between the high side voltage rail and the low side voltage rail; and a power converter circuitry arranged between the high side voltage rail and the low side voltage rail. The power converter circuitry including semiconductor switches, wherein the high side voltage rail and/or the low side voltage rail include a solid state power controller as described herein. Further, the controller of the solid state power controller is configured to set the driver signal generating device in the first state in a pre-charging phase before the power converter circuitry is fully connected to the power supply.

The power converter circuitry may be an inverter circuitry. Further, the power converter may be a three phase inverter.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

The present disclosure will be explained in more detail on the basis of exemplary embodiments with reference to the accompanying drawings in which.

DETAILED DESCRIPTION

Figure 4:
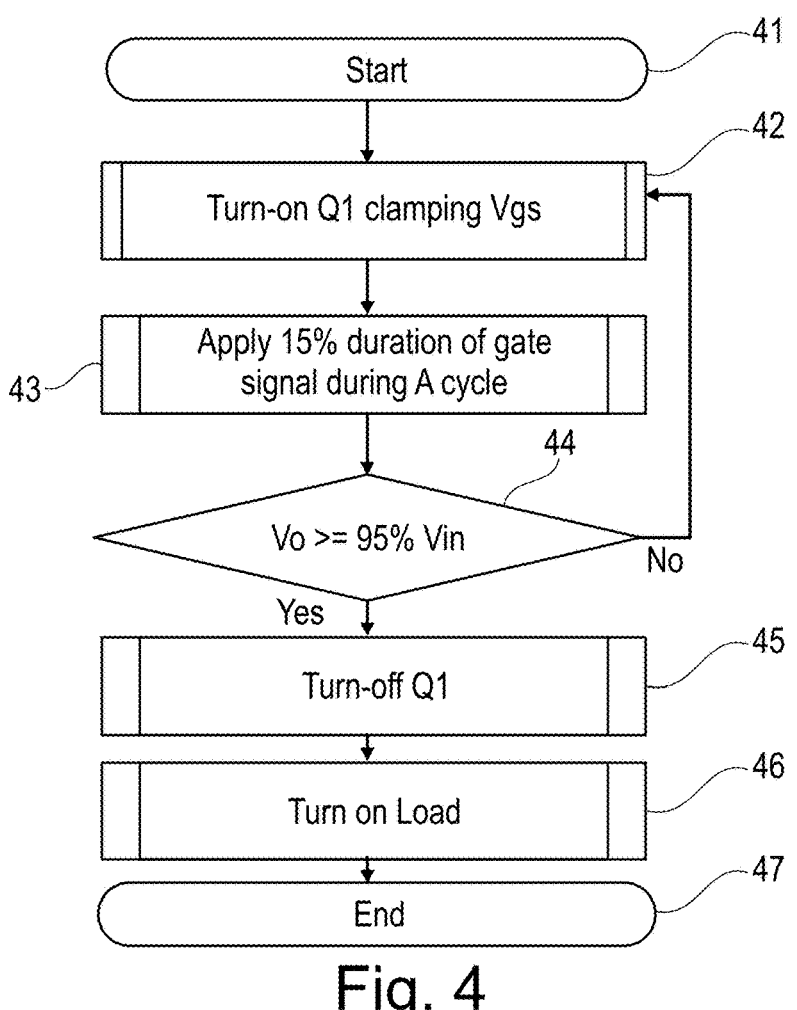
FIG. 4 is a flowchart of an example of a method used in the SSPC of FIG. 3, the method implementing active pre-charging of a capacitive load with constant pulse control.
Figure 5:
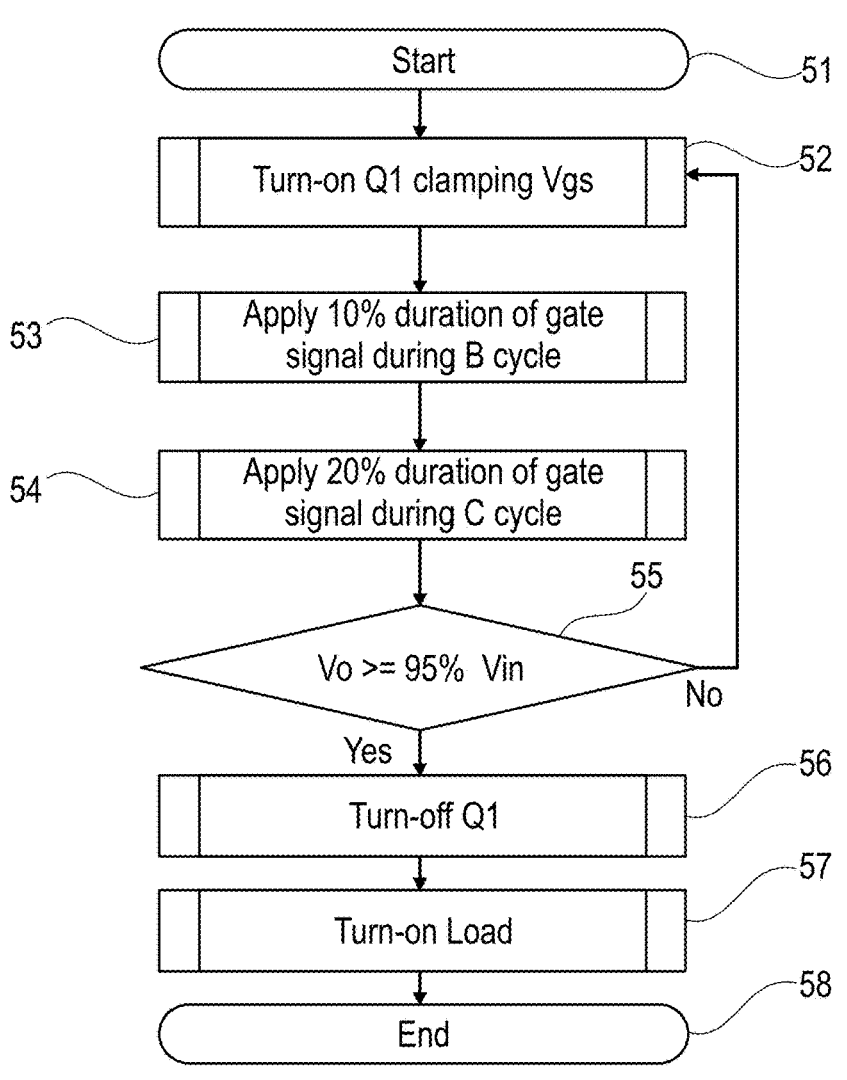
FIG. 5 is a flowchart of an example of a method used in the SSPC of FIG. 3, the method implementing active pre-charging of a capacitive load with variable pulse control.
Figure 6:
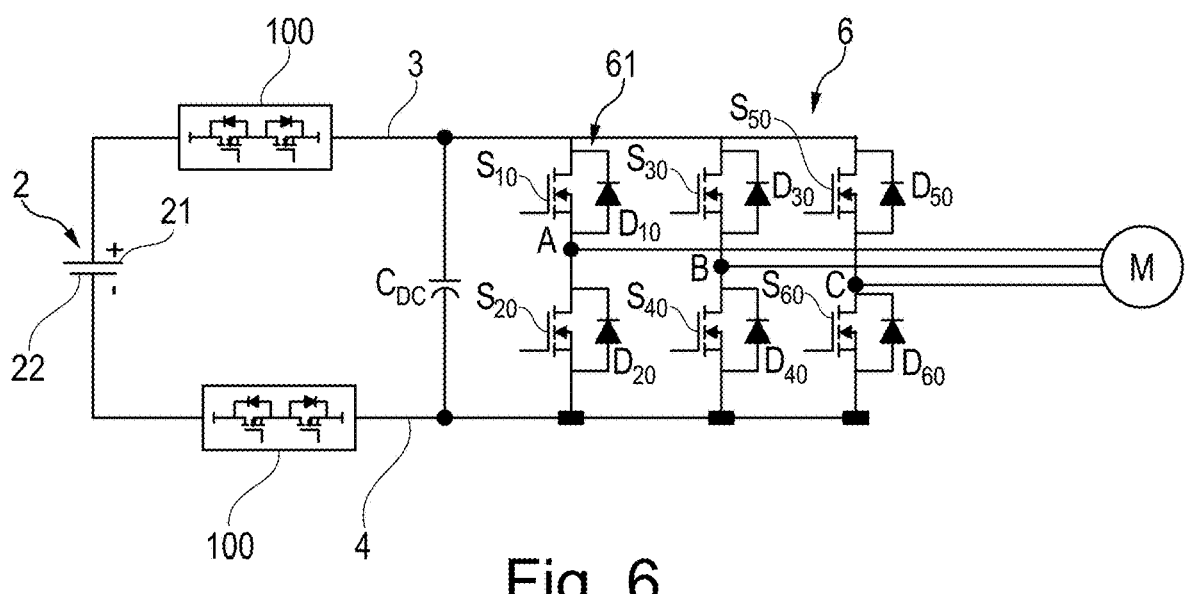
FIG. 6 is a standard three-phase inverter circuit for motor drive applications including an SSPC.
Figure 7:
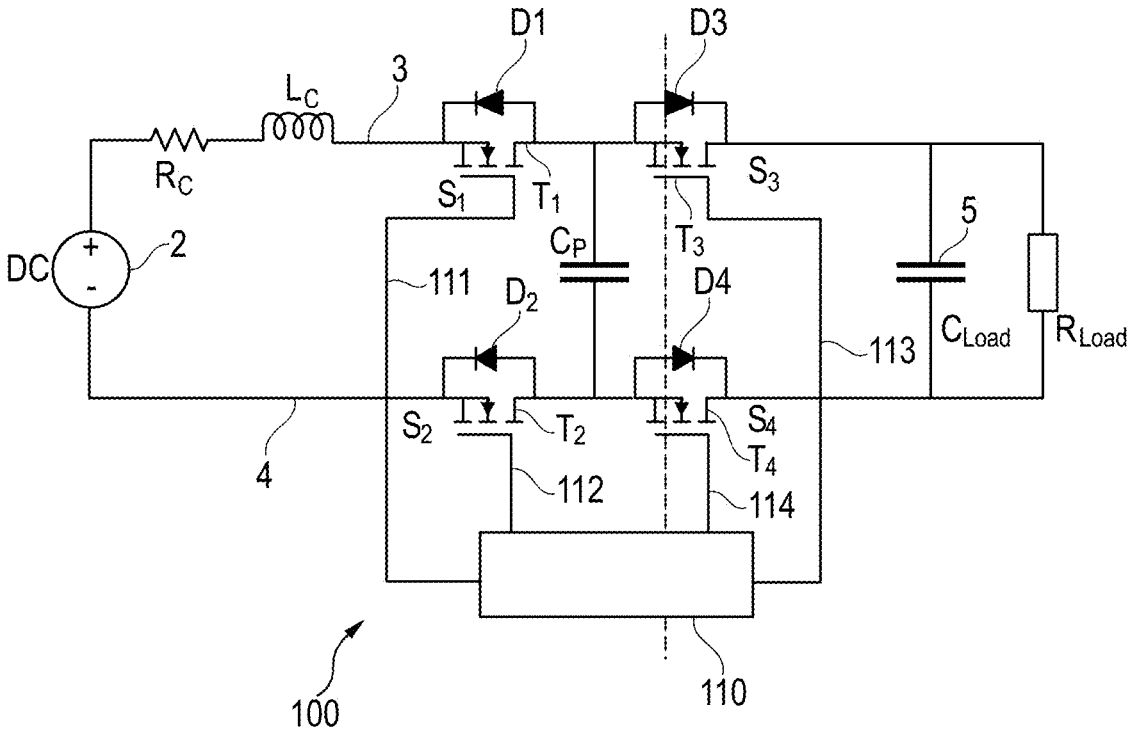
FIG. 7 shows a circuit similar to the circuit of FIG. 6 with additional details regarding the SSPC.

Before discussing embodiments of the present disclosure with respect to FIGS. 1 to 5, the background of the present disclosure is discussed with respect to FIGS. 6 and 7 to provide for a better understanding of the present disclosure.

FIG. 6 shows a standard three-phase inverter circuit for motor drive applications. The inverter circuit includes a power supply 2 (such as a DC battery) that has a positive terminal 21 and a negative terminal 22. Between the positive terminal 21 and the negative terminal 22 a battery voltage is present. A high side voltage rail 3 is connected to the DC positive terminal 21 and a low side voltage rail 4 is connected to the DC negative terminal 22. The high side voltage rail 3 and the low side voltage rail 4 form a high-voltage bus.

The inverter circuit 1 further includes a filtering capacitor $C_{DC}$ and an inverter circuitry 6 both arranged between the high side voltage in real 3 and the low side voltage rail 4. The inverter circuitry 6 includes six semiconductor power switches 61 that provide for a three-phase current U, V, W for a load M as is well known to the person skilled in the art.

The semiconductor power switches 61 each include a transistor S10-S60 and a bypass diode D10-D60. The switches 61 may be GaN (gallium nitride), SiC (silicon carbide), or IGBT (Insulated Gate Bipolar Transistor) switches.

The high side voltage rail 3 and the low side voltage rail 4 may be formed by a busbar configuration (short: busbar). The busbars 3, 4 may be made of copper or aluminum metal bars that carry large amounts of current. The busbars 3, 4 with mounted filtering capacitors $C_{DC}$ and connected to the energy supply 2 may be termed as DC links and the filtering capacitors $C_{DC}$ mounted on these busbars may be termed as DC link capacitors configured to filter any AC noise present in the DC line, e.g., when operating at higher voltage levels.

FIG. 6 further shows schematically that a solid state power controller 100 (in the following referred to as SSPC) is integrated both into the high side voltage rail 3 and the low side voltage rail 4. The SSPC is bi-directional and able to isolate both voltage rails 3, 4 in case of a fault. The SSPC is further configured to connect loads such as the inverter 6 to the high-voltage bus.

FIG. 7 is similar to FIG. 6 but shows more detail regarding the SSPC 100. The load is depicted in a generalized manner as $R_{Load}$, wherein $R_{Load}$ may be formed, e.g., by the inverter 6 of FIG. 6. A capacitive load 5 may be depicted as $C_{Load}$. It may include the DC link capacitors $C_{DC}$ of FIG. 6 and further capacitors.

The SSPC 100 includes four semiconductor switches S1 to S4, wherein each switch includes a transistor T1-T4 and a bypass diode D1-D4. The transistors may be MOSFET, IGBT, GaN, or SiC transistors. The switches S1 to S4 (namely, the transistors T1-T4) are controlled by the respective gate voltage that is provided through lines 111-114 by a gate driver circuit 110. The diodes D1-D4 give current that flows in the opposite direction a path to flow. If the diode D1-D4 is not used, inductive current ceases instantly, generating high voltage peaks.

The SSPC 100 further includes a capacitor $C_p$ that has a much smaller capacity than the capacitive load $C_{Load}$. In certain examples, capacitor $C_p$ is intermittently charged by switches S1 to S4 and transfers its current to $C_{Load}$ during pre-charge.

A general problem of an SSPC as shown in FIG. 7 may occur in case of a soft start, when the SSPC pre-charges the load capacitor $C_{Load}$, as a sudden rise of inrush current and voltage spike may not only destroy the load capacitor $C_{Load}$ but also destroy the switches and other connected applications. To avoid this issue and suppress transient voltage and current, the present disclosure provides for an active pulse control solid state protection controller (SSPC) 1 as shown in FIG. 1.

Figure 1:
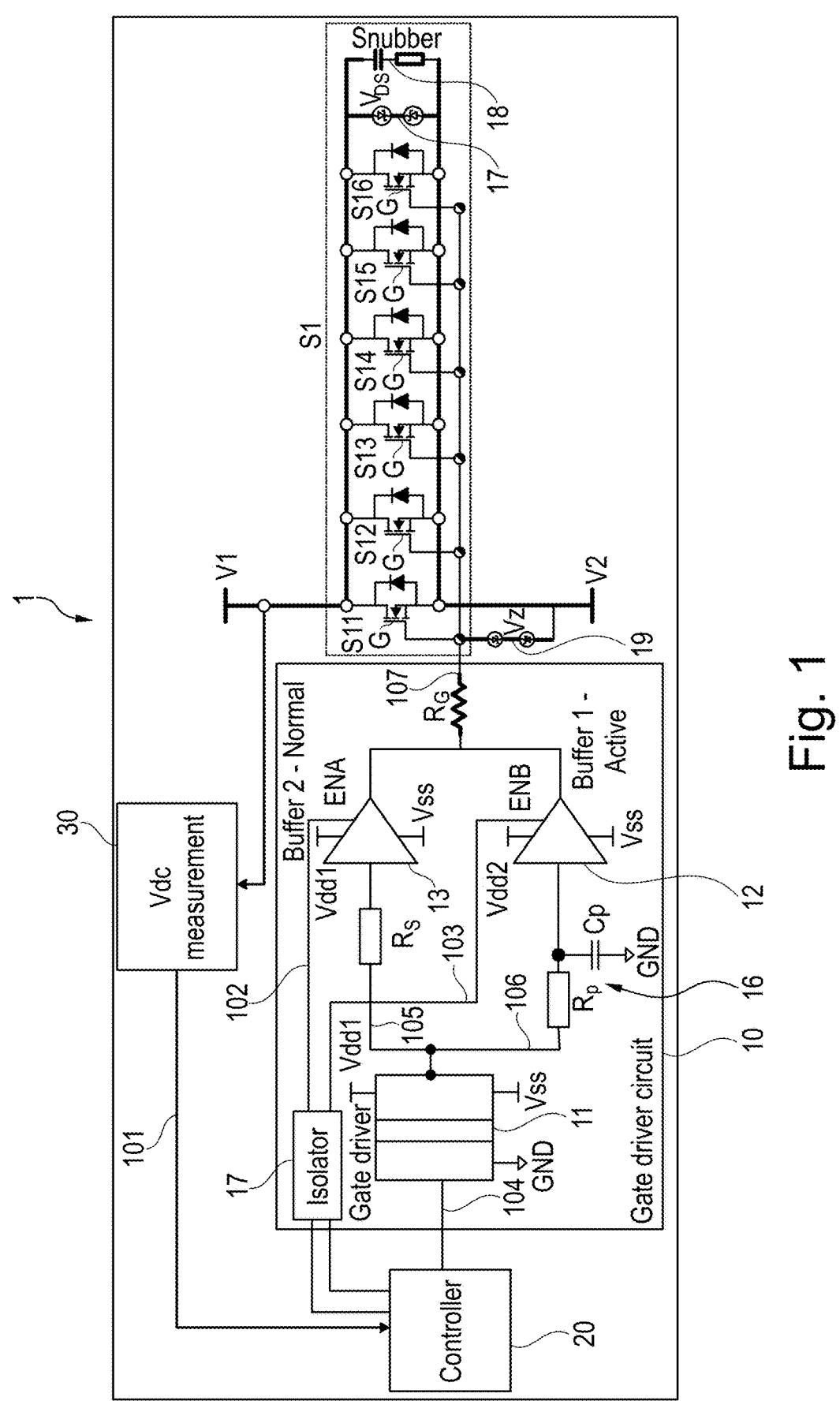
FIG. 1 is a first embodiment of an SSPC, the SSPC including two buffers generating first and second pulsed driver signals operating a semiconductor switch in an active region or in a saturated region.

The SSPC1 of FIG. 1 includes a semiconductor switch S1, a gate driver circuit 10, a controller 20, and a measurement unit 30.

The semiconductor switch S1 may include a plurality of semiconductor switches S11-S16 arranged in parallel, wherein each switch includes a transistor and a bypass diode as discussed with respect to FIG. 7. Each switch S11-S16 includes a Gate G that represents the control terminal controlling operation of the respective switch, as is well known to the skilled person. All Gates G are supplied with the same driver signal, which is supplied through line 107 by the gate driver circuit 10. The switches S11-S16 may be MOSFET, IGBT, GaN, or SiC switches. By providing a plurality of switches S11-S16, a higher current may be switched. Naturally, the amount of switches S11-S16 shown in FIG. 1 is exemplary only.

In parallel to the switches S11-S16 are further arranged a transient voltage suppressor diode 17 and a RC snubber sequence 18 that serve to suppress transient voltage spikes. Further, a transient voltage suppressor diode 19 is provided that is connected across the Gates G and sources of the switches S11-S16. The transient voltage suppressor diode 19 serves to suppress a transient spike in gate voltage due to its Miller capacitor charging.

The source and drain of the switches S11-116 are connected to two DC voltages V1, V2, which may be the terminal voltages of a power supply such as in FIGS. 6 and 7 and/or may be voltages within a circuit. For example, the semiconductor switch S1 may be the semiconductor switch S1 of the circuit of FIG. 7, in which case the voltage V1 is the voltage of the high side voltage rail 3 of FIG. 7 and the voltage V2 is voltage between switches S1 and S3 of FIG. 7.

Because it is of relevance for the following, a switch S11-S16 may have three operating regions. A first operating region is a cut-off region, in which the switch is operating when the gate-to-source voltage is less than a threshold voltage Vth. The cut-off region is also known as sub-threshold region. In this region, the dependence of current on gate voltage is exponential. The magnitude of current flowing through the switch in the cut-off region is negligible as the channel is not present.

A second operating region is the active region, also known as linear or non-saturation region. For a switch, as gate voltage increases beyond the threshold voltage Vth, a channel is formed between source and drain terminals. Now, if there is voltage difference between source and drain, current will flow. The magnitude of the current increases linearly with increasing drain voltage.

A third operating region is the saturation region. For a switch, at a particular gate and source voltage, there is a particular level of voltage for drain, beyond which, increasing drain voltage has no effect on current. When a switch operates in this region, it is said to be in saturation.

The measurement unit 30 measures a DC link voltage across a charging capacitor $C_{Load}$ (such as in FIG. 7). The measurement unit 30 may be implemented by a voltage sensor. The measurement unit 30 outputs a voltage level signal which is supplied through line 101 as input to the controller 20.

The controller 20 generates a pulsed signal (such as a pulse-width modulated signal) and outputs the pulsed signal on line 104. It further provides, through an isolator 17, to enable signals ENA and ENB on lines 102 and 103, wherein the enable signals ENA and ENB are provided depending on the voltage level signal provided by measuring unit 30 over line 101, as is discussed in more detail below.

The gate driver circuit 10 includes a gate driver 11, a first buffer 12, a second buffer 13, the insulator 17, and further elements $R_p$, $C_p$, $R_S$, $R_G$. The gate driver 11 receives the pulsed signal from controller 20 on line 104 and outputs a pulsed output signal, which is provided by lines 105 and 106, respectively, to buffers 13 and 12. The gate driver 11 has a positive supply voltage Vdd1 and a negative supply voltage Vss, which determine the voltage of the pulsed output signal.

The pulsed driver signal is supplied on line 106 through an RC circuit 16 that includes a resistor $R_p$ and a capacitor $C_p$ to the first buffer 12. The pulsed driver signal is further supplied on line 105 through a resistor $R_s$ to the second buffer 13.

The RC circuit 16 is connected before the first buffer 12 to soft-start and soft turn off the semiconductor switches S11-S16 (power devices). The additional RC circuit 16 after the gate driver 11 to the first (active region) buffer 12 enables the use of COTs (Commercially available gate driver), allowing expansion on higher voltage operating conditions.

The first buffer 12 operates under a first supply voltage Vdd2, wherein the second buffer 13 operates under the second supply voltage Vdd1, which is the supply voltage of the gate driver 11. The first supply voltage Vdd2 is lower than the second supply voltage Vdd2. For example, Vdd2 may be in the range of 10V, while Vdd1 may be in the range of 20V.

Because of the different supply voltages, the first buffer 12 generates as output a first pulsed driver signal that operates the semiconductor switches S11-S16 in the active region. On the other hand, the second buffer 13 generates as output a second pulsed driver signal that operates the semiconductor switches S11-S16 in the saturated region. Which one of the buffers 12, 13 is used is decided by the controller 2 which provides the enable signals ENA and ENB.

The semiconductor switches S11-S17 are operated by the controller 2 in the active region via continuous high frequency pulses, namely, the first pulsed driver signal is provided by the first buffer 12 until a load capacitor (such as load capacitor $C_{Load}$ of FIG. 7) is charged up to a predefined percentage, such as 90 percent, of a rated voltage. After having reached the predefined percentage of charge, the semiconductor switches S11-D17 are operated in the saturated region (by the second pulsed driver signal provided by the second buffer 13) to fully charge the load capacitor.

Once the soft start up ends, the gate driver 11 will go back and control the second (normal region) buffer 13 to continue the operation of the SSPC 1. This secures that at no point during operation voltage spikes and transient currents go beyond the operating limit of the power semiconductor device 1 during pre-charging conditions.

The first buffer 12 and the second buffer 13 together form a driver signal generating device which receives the gate driver pulsed output signal from the gate driver 11 and generates the pulsed driver signal. By enabling the first buffer 12 or the second buffer 13 through enable signals ENA, ENB, two different states of such driver signal generating device are realized, wherein, in one state, the semiconductor switches S11-S16 are operated in the active region, and wherein, in the other state, the semiconductor switches S11-S16 are operated in the saturated region.

The SSPC 1 as shown in FIG. 1 may be implemented in the circuit of FIG. 6, wherein the gate driver circuit 110 is implemented by the gate driver circuit 10 of FIG. 1, and wherein all of the semiconductor switches S1 to S4 of FIG. 6 may be controlled in the same manner as semiconductor switch S1 of FIG. 1. However, this is to be understood as an example only. The SSPC 1 as shown in FIG. 1 may be implemented in other circuits and configurations as well. In particular, it may be implemented in any power management system with a DC power supply.

Figure 2:
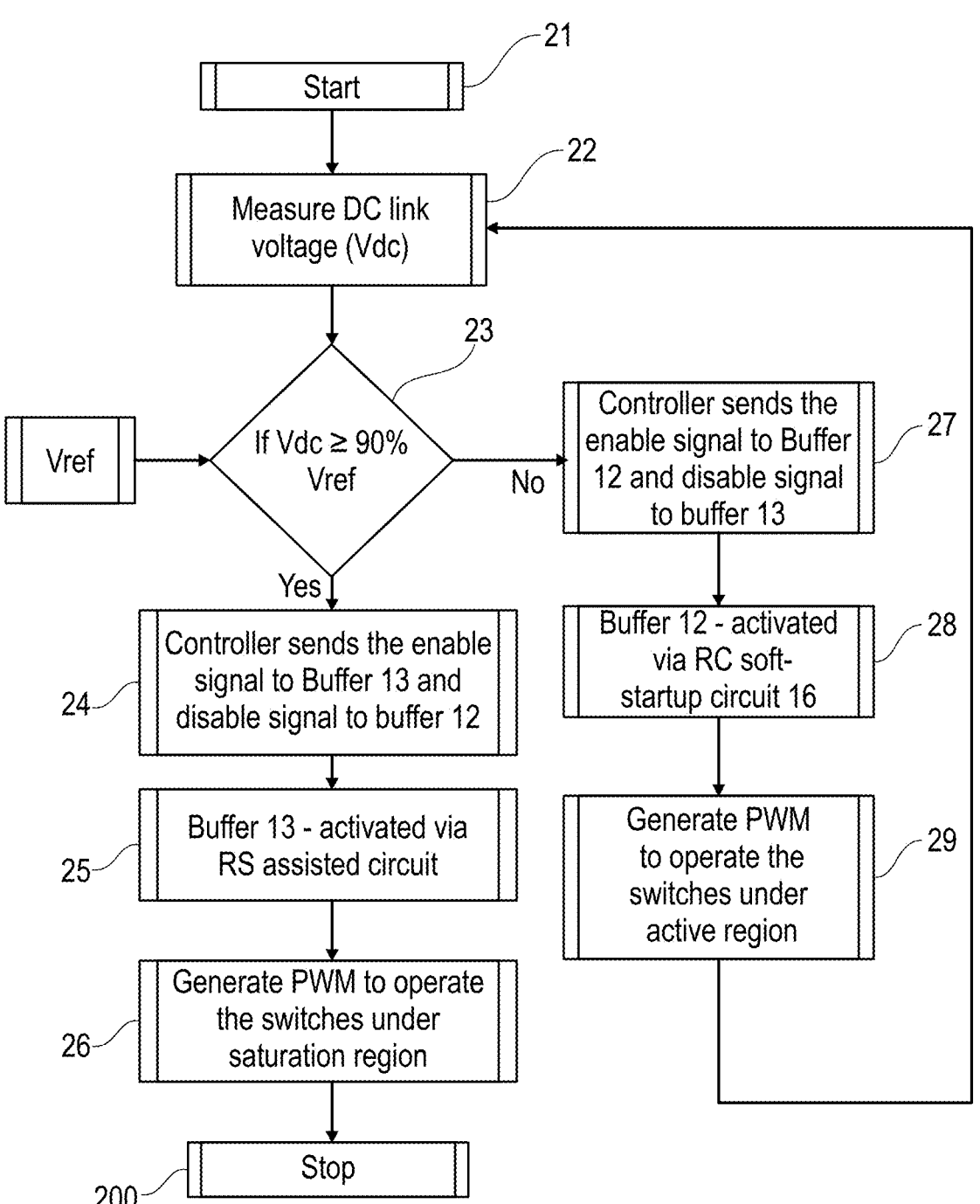
FIG. 2 is a flowchart of an example of a method used in the SSPC of FIG. 1, the method controlling active pre-charging of a capacitive load.

FIG. 2 is a flowchart of the sequence of acts implemented when pre-charging a capacitive load to suppress transient current and transient voltage during start up. As discussed with respect to FIG. 1, the active pulse control uses two isolated buffers 13, 12 after the gate driver 11. One of the buffers 12 provides the power semiconductor switches S11-S16 active region and the other buffer 13 provides the power semiconductor switches S11-S16 saturation region. The input of the gate driver 11 is enabled from the controller 20, wherein the controller 20 receives feedback from the measurement unit 30 which measures the DC link voltage across a charging capacitor.

As depicted in the flowchart, after start 21, the DC link voltage $V_{dc}$ is measured by measurement unit 30 in act 22.

In act 23, the controller 20 receives the capacitor charging voltage information Vdc from the measurement unit 30, and it compares with a DC link reference voltage Vref.

If Vdc≥90% Vref, then in act 24, the controller 20 sends the enable signal ENA to the second buffer 13 and a disable signal to the first buffer 12.

In that case, in act 25, the second buffer 13 is activated via $R_S$, and, in act 26, a pulse width modulated driver signal (PWM) is generated to operate the semiconductor switches 11-16 in the saturation region to fully charge a load capacitor.

However, if the feedback voltage Vdc is less than the reference voltage Vref, in act 27, the controller 20 sends an enable signal ENA to the first buffer 12 and a disable signal to the second buffer 13.

In that case, in act 28, the first buffer 12 is activated via the RC soft start circuit 16 to suppress the transient voltage spike, and a pulse width modulated driver signal is generated to operate the semiconductor switches 11-16 in the active region to suppress inrush current of a charging capacitor. The process stops at 200.

In the embodiment shown in FIG. 1, the first buffer 12 and the second buffer 13 together form a driver signal generating device that receives the gate driver pulsed output signal from the gate driver and generates the pulsed driver signal. Such driver signal generating device may be implemented in other manners as well. One alternative is shown in FIG. 3.

Figure 3:
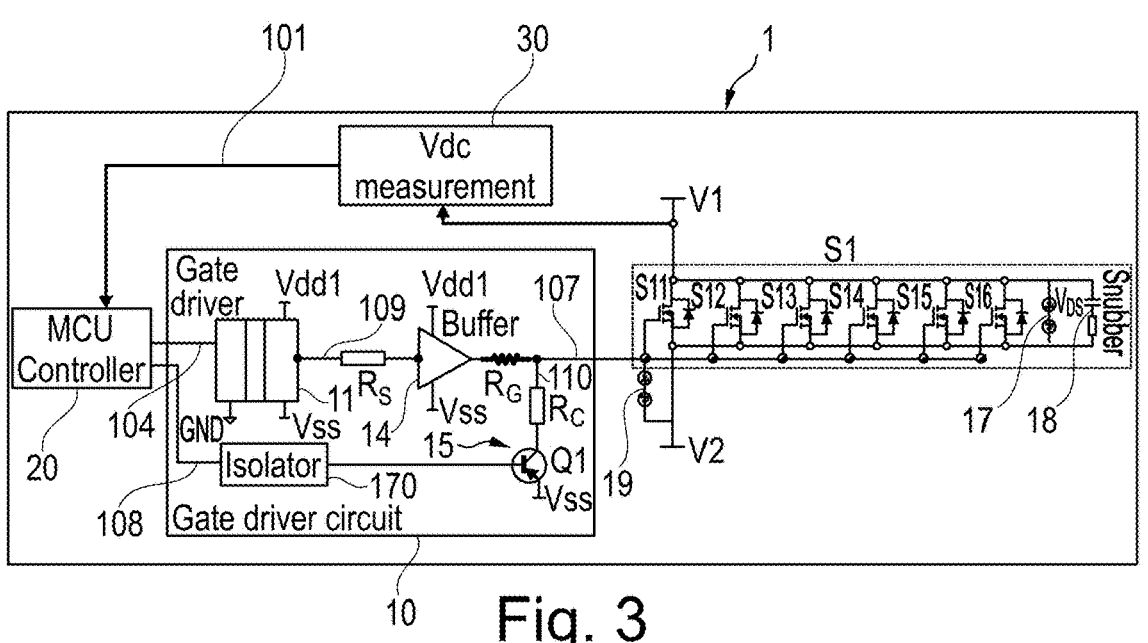
FIG. 3 is a second embodiment of an SSPC, the SSPC including a buffer configured to generate a pulsed driver signal and a buffer output modifying device or component configured to change the voltage level of the buffer output signal, thereby providing for first and second pulsed driver signals operating a semiconductor switch in an active region or in a saturated region.

The embodiment shown in FIG. 3 is similar to the embodiment of FIG. 1 except for the implementation of the driver signal generating device. In FIG. 3, the driver signal generating device includes a buffer 14 that receives the pulsed output signal from the gate driver 11 on line 109. Buffer 14 generates a pulsed driver signal, which is put on line 107 through resistor $R_G$. The driver signal generating device further includes a buffer output modifying device 15 configured to modify the voltage level of the pulsed driver signal.

More particularly, the buffer output modifying device 15 includes a current path 110 having a transistor Q1 activatable by the controller 20 and a further resistor $R_C$ connected in series to the resistor $R_G$. The transistor Q1 may be activated by the controller 20 through the voltage on line 108. When current flows through transistor Q1, the resistors $R_G$ and $R_C$ form a voltage divider for the semiconductor switches S11-S16.

Accordingly, in a first state, when the transistor Q1 is activated (i.e., conducts current), the voltage level of the generated pulsed driver signal is reduced. In such case, a lower first pulsed driver signal is present on line 107 such that the semiconductor switches S11-S16 are operated in the active region.

On the other hand, when the transistor Q1 is deactivated (i.e., does not conduct current), the voltage level at the output of buffer 14 is not reduced such that the pulsed driver signal provided by buffer 14 is a second pulsed driver signal with a voltage level such that the semiconductor switches S11-S16 are operated in the saturated region.

The embodiment of FIG. 3 may be referred to as a "voltage clamping embodiment," wherein the buffer output modifying device 15 may be referred to as a clamping device or component.

The SSPC 1 of FIG. 3 may be implemented with two different pulse control methods, which are illustrated in FIGS. 4 and 5.

FIG. 4 shows a constant pulse control method. After start 41, in act 42, the clamping circuit 15 is turned on by turning on transistor Q1, thereby clamping the voltage $V_{GS}$ to the buffer 14 output.

In act 43, an "A duty cycle" is defined in which the voltage of Q1 is clamped for 15% duration. The control signal for transistor Q1 is outputted by controller 20 on line 108 through isolator 170.

In act 44, the voltage $V_0$ over a load capacitor (such as load capacitor $C_{Load}$ of FIG. 7) is monitored and compared with a threshold level which is defined to be equal or higher 95% than an input voltage Vin.

When the voltage $V_0$ reaches the threshold level, in act 45, the clamping circuit/Q1 is turned off, such that the gate voltage on line 110 is transferred to the higher level making the semiconductor switches fully conductive.

In act 46, the load will tie to the circuit and end the pre-charging process. The process stops at 47.

FIG. 5 shows a variable pulse control method. After start 51, in act 52, the clamping circuit 15 is turned on by turning on transistor Q1, thereby clamping the voltage $V_{GS}$ to the buffer 14 output.

In act 53, a "B duty cycle" is defined in which the voltage of Q1 is clamped for 10% duration.

In a subsequent act 54, the duty cycle is increased to 20 percent in a "C duty cycle."

In act 55, the voltage $V_0$ over a load capacitor (such as load capacitor $C_{Load}$ of FIG. 7) is monitored and compared with a threshold level which is defined to be equal or higher 95% than an input voltage Vin.

When the voltage $V_0$ reaches the threshold level, in act 56, the clamping circuit/Q1 is turned off, such that the gate voltage on line 110 is transferred to the higher level making the semiconductor switches fully conductive. The process stops at 58. In the method of FIG. 5, as the duty cycle changes from B cycle to C cycle, the pulse is variable.

It should be understood that the above description is intended for illustrative purposes only and is not intended to limit the scope of the present disclosure in any way. Also, those skilled in the art will appreciate that other aspects of the present disclosure may be obtained from a study of the drawings, the disclosure, and the appended claims.

All methods described herein may be performed in any suitable order unless otherwise indicated herein or otherwise clearly contradicted by context. Various features of the various embodiments disclosed herein may be combined in different combinations to create new embodiments within the scope of the present disclosure. In particular, the present disclosure extends to and includes all combinations and sub-combinations of one or more features described herein. Any ranges given herein include any and all specific values within the range and any and all sub-ranges within the given range.

The invention claimed is:

1. A solid state power controller for limiting and/or breaking an electrical current flowing through a power transmission line, the solid state power controller comprising:

at least one semiconductor switch having a control terminal;

a controller configured to generate a pulsed signal; and a gate driver circuit configured to receive the pulsed signal generated by the controller and generate a pulsed driver signal that is applied to the control terminal of the at least one semiconductor switch, wherein the gate driver circuit comprises:

a gate driver configured to receive from the controller the pulsed signal and provide a pulsed output signal; and driver signal generating device configured to operate in a first state and a second state, wherein the first state and the second state are controlled by the controller, wherein the driver signal generating device is configured to: receive the pulsed output signal from the gate driver; generate, in the first state, a first pulsed driver signal that operates the at least one semiconductor switch in an active region; and generate, in the second state, a second pulsed driver signal that operates the at least one semiconductor switch in a saturated region, and wherein the controller is configured to set the driver signal generating device in the first state or in the second state depending on a voltage level signal received by the controller.

2. The solid state power controller of claim 1, wherein the driver signal generating device comprises:

a first component configured to receive the pulsed output signal in the first state and generate the first pulsed driver signal, and a second component configured to receive the pulsed output signal in the second state and generate the second pulsed driver signal.

3. The solid state power controller of claim 2, wherein the first component comprises a first buffer configured to operate under a first supply voltage, wherein the second component comprises a second buffer configured to operate under a second supply voltage, and wherein the first supply voltage is lower than the second supply voltage.

4. The solid state power controller of claim 3, wherein a resistor-capacitor (RC)-circuit is arranged at an input of the first buffer.

5. The solid state power controller of claim 1, wherein the driver signal generating device comprises:

a buffer configured to receive the pulsed output signal and generate the pulsed driver signal; and buffer output modifying component configured to reduce a voltage level of the generated pulsed driver signal, wherein the buffer output modifying component is activatable by the controller, wherein, in the first state, the buffer output modifying component is activated and the voltage level of the generated pulsed driver signal is reduced to provide the first pulsed driver signal, and wherein, in the second state, the buffer output modifying component is deactivated and the generated pulsed driver signal is the second pulsed driver signal.

6. The solid state power controller of claim 5, wherein the buffer output modifying component comprises a current path having a transistor activatable by the controller and a second resistor connected in series to a first resistor that is arranged between the buffer and the at least one semiconductor switch, and wherein the first resistor and the second resistor form a voltage divider for the at least one semiconductor switch.

7. The solid state power controller of claim 1, wherein the at least one semiconductor switch comprises a Metal-Oxide-Semiconductor Field-Effect Transistor (MOSFET), an Insulated-Gate Bipolar Transistor (IGBT), a Gallium Nitride (GaN) transistor, or a Silicon Carbide (SiC) transistor.

8. The solid state power controller of claim 1, wherein the at least one semiconductor switch comprises a plurality of semiconductor switches arranged in parallel, and wherein each semiconductor switch of the plurality of semiconductor switches comprises a respective control terminal to which the first pulsed driver signal or the second pulsed driver signal is applied.

9. The solid state power controller of claim 8, wherein a transient voltage suppressor diode and/or an RC snubber sequence are arranged in parallel to the plurality of semiconductor switches.

10. The solid state power controller of claim 1, wherein the solid state power controller further comprises a measuring device configured to measure voltage over a load capacitor and generate the voltage level signal received by the controller.

11. The solid state power controller of claim 10, wherein the controller is configured to set the driver signal generating device in the first state when the voltage level signal received by the controller indicates that the load capacitor is charged with less than a predefined percentage of a rated voltage, and wherein the controller is configured to set the driver signal generating device in the second state when the voltage level signal received by the controller indicates that the load capacitor is charged with more than the predefined percentage of the rated voltage.

12. The solid state power controller of claim 11, wherein the predefined percentage is 90% of the rated voltage.

13. The solid state power controller of claim 1, wherein the solid state power controller is configured to provide the first pulsed driver signal and the second pulsed driver signal that are pulse-width modulated driver signals of high-frequency.

14. A power management system comprising:

a direct current (DC) power supply;

a load and a load capacitor; and a power bus connecting the power supply and the load, wherein the power bus comprises a solid state power controller, wherein the solid state power controller comprises: at least one semiconductor switch having a control terminal; a controller configured to generate a pulsed signal; and a gate driver circuit configured to receive the pulsed signal generated by the controller and generate a pulsed driver signal that is applied to the control terminal of the at least one semiconductor switch, wherein the gate driver circuit of the solid state power controller comprises:

a gate driver configured to receive from the controller the pulsed signal and provide a pulsed output signal; and driver signal generating device configured to operate in a first state and a second state, wherein the first state and the second state are controlled by the controller, wherein the driver signal generating device is configured to: receive the pulsed output signal from the gate driver; generate, in the first state, a first pulsed driver signal that operates the at least one semiconductor switch in an active region; and generate, in the second state, a second pulsed driver signal that operates the at least one semiconductor switch in a saturated region, wherein the controller of the solid state power controller is configured to set the driver signal generating device in the first state or in the second state depending on a voltage level signal received by the controller, and wherein the controller of the solid state power controller is further configured to set the driver signal generating device in the first state in a pre-charging phase before the load is fully connected to the power supply.

15. The power management system of claim 14, wherein the controller of the solid state power controller is configured to set the driver signal generating device in the first state if the voltage level signal received by the controller indicates that the load capacitor is charged with less than a predefined percentage of a rated voltage.

16. A power converter comprising:

a direct current (DC) power supply having a DC positive terminal, a DC negative terminal, and a DC voltage;

a high side voltage rail connected to the DC positive terminal;

a low side voltage rail connected to the DC negative terminal;

a load capacitor arranged between the high side voltage rail and the low side voltage rail; and a power converter circuitry arranged between the high side voltage rail and the low side voltage rail, the power converter circuitry comprising semiconductor switches, wherein the high side voltage rail and/or the low side voltage rail comprise a solid state power controller, wherein the solid state power controller comprises: at least one semiconductor switch having a control terminal; a controller configured to generate a pulsed signal; and a gate driver circuit configured to receive the pulsed signal generated by the controller and generate a pulsed driver signal that is applied to the control terminal of the at least one semiconductor switch, wherein the gate driver circuit of the solid state power controller comprises:

a gate driver configured to receive from the controller the pulsed signal and provide a pulsed output signal; and driver signal generating device configured to operate in a first state and a second state, wherein the first state and the second state are controlled by the controller, wherein the driver signal generating device is configured to: receive the pulsed output signal from the gate driver; generate, in the first state, a first pulsed driver signal that operates the at least one semiconductor switch in an active region; and generate, in the second state, a second pulsed driver signal that operates the at least one semiconductor switch in a saturated region, wherein the controller of the solid state power controller is configured to set the driver signal generating device in the first state or in the second state depending on a voltage level signal received by the controller, and wherein the controller of the solid state power controller is further configured to set the driver signal generating device in the first state in a pre-charging phase before the power converter circuitry is fully connected to the power supply.

17. The power converter of claim 16, wherein the power converter circuitry is an inverter circuitry.

18. The power converter of claim 16, wherein the power converter circuitry is a three phase inverter.

* * * * *